US012615016B1

(12) United States Patent　　　　　(10) Patent No.:　US 12,615,016 B1
Köllmann　　　　　　　　　　　　　　(45) Date of Patent:　Apr. 28, 2026

(54) SERIES RESONANCE OSCILLATOR

(71) Applicant: NXP USA, Inc., Austin, TX (US)

(72) Inventor: Andreas Johannes Köllmann, Rosengarten (DE)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 18/984,154

(22) Filed: Dec. 17, 2024

(51) Int. Cl.
　　*H03B 5/12*　　　　　(2006.01)
(52) U.S. Cl.
　　CPC ..... *H03B 5/1206* (2013.01); *H03B 2200/009*
　　　　　　　　　　　　　　　　　　(2013.01)
(58) Field of Classification Search
　　CPC ........................ H03B 5/1206; H03B 2200/009
　　See application file for complete search history.

(56) References Cited

U.S. PATENT DOCUMENTS

| | | | |
|---|---|---|---|
| 10,505,525 B2 | 12/2019 | Andreani et al. | |
| 11,543,850 B1 * | 1/2023 | Dedic | H03F 3/505 |
| 11,936,339 B2 | 3/2024 | Franceschin et al. | |
| 2019/0355511 A1 * | 11/2019 | Dekker | H03B 5/1221 |

FOREIGN PATENT DOCUMENTS

CN　　116722822 A　　9/2023

OTHER PUBLICATIONS

Franceschin, Alessandro et al., "Ultra-Low Phase Noise X-Band BiCMOS VCOs Leveraging the Series Resonance", IEEE Journal of Solid-State Circuits, vol. 57, No. 12, p. 3514-3526 (Dec. 2022).
Pepe, Federico et al., "On the Remarkable Performance of the Series-Resonance CMOS Oscillator", IEEE Transactions on Circuits and Systems-1: Regular Papers, vol. 65, No. 2, p. 531-542 (Feb. 2018).
S. Zhang et al., "A 100 MHZ-Reference, 10.3-to-11.1 GHz Quadrature PLL with 33.7-fsrms J itter and -83.9 dBc Reference Spur Level using a -130.8 dBc/Hz Phase Noise at 1MHz offset Folded Series-Resonance VCO in 65nm CMOS," 2023 IEEE Custom Integrated Circuits Conference (CICC), San Antonio, TX, USA, 2023, pp. 1-2.

* cited by examiner

*Primary Examiner* — Jeffrey M Shin
(74) *Attorney, Agent, or Firm* — Andrew C. Milhollin

(57)　　　　　　ABSTRACT

The present disclosure relates to an oscillator, such as a series resonance oscillator, which includes an inverter, non-inverting buffer circuitry including, a first transistor having a first gate terminal and a first source terminal, and a second transistor having a second gate terminal and a second source terminal, a first inductor-capacitor (LC) tank coupled between the inverter and an output of the non-inverting buffer circuitry, and a second LC tank coupled between the inverter and an input of the non-inverting buffer circuitry, where the first gate and second gate terminals are coupled to the input of the non-inverting buffer circuitry, the first and second source terminals are coupled to the output of the non-inverting buffer circuitry, the first and second source terminals are separately direct-current (DC)-biased, and the first and second gate terminals are separately DC-biased.

20 Claims, 6 Drawing Sheets

SERIES RESONANCE OSCILLATOR

TECHNICAL FIELD

Embodiments of the subject matter described herein relate generally to oscillator circuits, including series resonance oscillator circuits.

BACKGROUND

Modern applications for wireless signal transmission/reception, such as mobile telecommunication, radio, or radar, typically have low phase noise requirements for clock or local oscillator (LO) signal generation in order to achieve better signal-to-noise specifications. Radio-frequency (RF) oscillators are commonly used in phase locked loops (PLLs), which are typically used for such clock and LO signal generation. Series resonance oscillators typically have low phase noise figures at the cost of high current consumption.

BRIEF DESCRIPTION OF DRAWINGS

A more complete understanding of the subject matter may be derived by referring to the detailed description and claims when considered in conjunction with the following figures, wherein like reference numbers refer to similar elements throughout the figures. Elements in the figures are illustrated for simplicity and clarity and have not necessarily been drawn to scale. The figures along with the detailed description are incorporated and form part of the specification and serve to further illustrate examples, embodiments and the like, and explain various principles and advantages, in accordance with the present disclosure, wherein:

DETAILED DESCRIPTION

Figure 1:
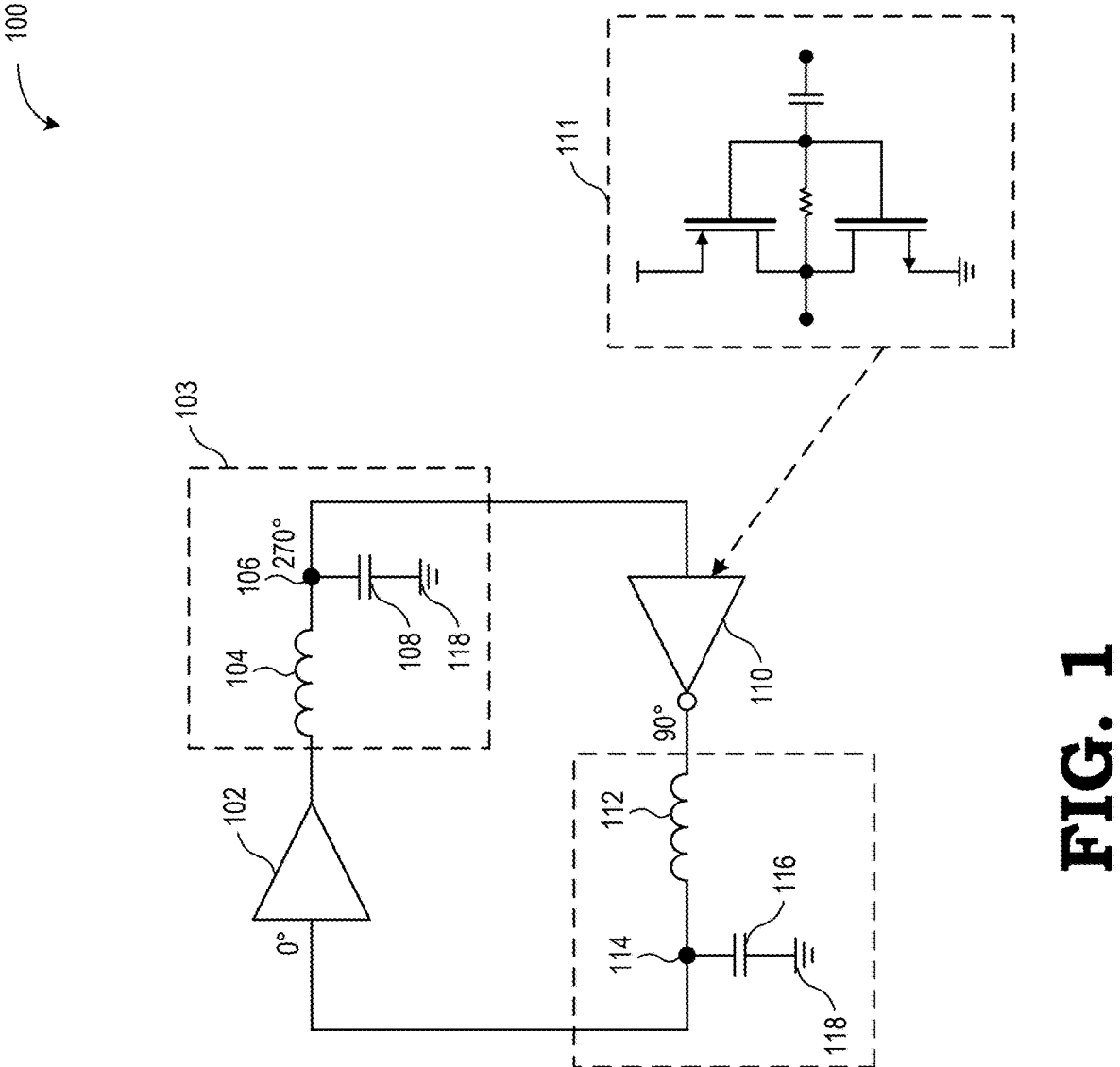
FIG. 1 shows an illustrative circuit diagram showing a series resonance oscillator that includes two inductor-capacitor (LC) tanks, an inverter, and a non-inverting buffer, in accordance with various embodiments.

The following detailed description is merely illustrative in nature and is not intended to limit the embodiments described herein and uses of such embodiments. Furthermore, there is no intention to be bound by any expressed or implied theory presented in the preceding technical field, background, or the following detailed description.

For simplicity and clarity of illustration, the figures illustrate the general manner of construction. Descriptions and details of well-known features and techniques may be omitted from the following detailed description to avoid unnecessarily obscuring the present disclosure. For example, the dimensions of some of the elements or regions in the figures may be exaggerated relative to other elements or regions to help improve understanding of embodiments described herein.

The terms "first," "second," "third," "fourth" and the like in the description and the claims, if any, may be used for distinguishing between similar elements and not necessarily for describing a particular sequential or chronological order. It is to be understood that the terms so used are interchangeable under appropriate circumstances such that the embodiments described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements but may include other elements not expressly listed or inherent to such process, method, article, or apparatus. As used herein the terms "approximate," "approximately," "substantial" and "substantially" mean sufficient to accomplish the stated purpose in a practical manner and that minor imperfections, if any, are not significant for the stated purpose.

Along these lines, when used with references to measurable quantities including, but not limited to, dimensions, these terms mean that the quantities are equal to the values stated subject to accepted tolerances of any methods or apparatus chosen to fabricate the described structures or measure the quantities or dimensions described. Directional references such as "top," "bottom," "left," "right," "above," "below," and so forth, unless otherwise stated, are not intended to require any preferred orientation and are made with reference to the orientation of the corresponding figure or figures for purposes of illustration. As used herein, the words "exemplary" and "example" mean "serving as an example, instance, or illustration." Any implementation described herein as exemplary or an example is not necessarily to be construed as preferred or advantageous over other implementations. In addition, certain terms may also be used herein for reference only, and thus are not intended to be limiting.

Herein, elements or nodes or features are sometimes referred to as being "connected" or "coupled" together. As used herein, unless expressly stated otherwise, "connected" means that one element is directly joined to (or directly communicates with) another element in an electrical or non-electrical manner, and not necessarily mechanically. Likewise, unless expressly stated otherwise, "coupled" means that one element is directly or indirectly joined to (or directly or indirectly communicates with) another element in an electrical or non-electrical manner, and not necessarily mechanically. Thus, although the schematic illustrations shown in the figures depict exemplary arrangements of elements, additional intervening elements, devices, features, or components may be present in one or more embodiments of the depicted subject matter.

Various embodiments described herein relate to series resonance oscillators that are implemented using two stages. Conventional series resonance oscillators typically include four resonance circuits and four driver stages. Each of the four driver stages in such conventional series resonance oscillators typically requires differential input signals, which increases routing complexity and susceptibility to layout parasitics at high frequencies. It may be desirable for each driver stage to exhibit low output impedance to enable driving the low impedance resonance circuits in the series resonance mode. Additionally, the use of four driver stages in such conventional embodiments results in relatively high current consumption and a relatively large layout size (e.g., footprint). Herein, "current" refers to electrical current, unless otherwise specified.

Embodiments herein address these challenges by implementing a two-stage series resonance oscillator, including a non-inverting buffer as a first driver stage and an inverter as a second driver stage, with first resonance circuitry (e.g., an inductor-capacitor (LC) tank) coupled between the output of the first driver stage and the input of the second driver stage and second resonance circuitry coupled between the output of the second driver stage and the input of the first driver stage. By using fewer driver stages than conventional four-stage series resonance oscillators, embodiments of the two-stage series resonance oscillators described herein may, advantageously, have reduced current consumption and a reduced footprint. In one or more embodiments, the driver stages of the two-stage series resonance oscillator may not require differential input signals, which may, advantageously, reduce routing complexity and susceptibility to high frequency layout parasitics, compared to conventional series resonance oscillators with driver stages that require differential input signals.

In one or more embodiments, a series resonance oscillator may include a non-inverting buffer as a first driver stage and an inverter as a second driver stage. The series resonance oscillator may include first LC tank circuitry coupled between the output of the non-inverting buffer and the input of the inverter. The series resonance oscillator may include second LC tank circuitry coupled between the output of the inverter and the input of the non-inverting buffer. The non-inverting buffer may include a first source-follower transistor and a second source-follower transistor. In one or more embodiments, the first and second source-follower transistors may be metal-oxide semiconductor field effect transistor (MOSFET) transistors. The first source-follower transistor may be a p-channel MOSFET (PMOS) transistor, and the second source-follower transistor may be an n-channel MOSFET (NMOS) transistor. The first and second source-follower transistors may include gate terminals or control terminals that are each coupled to the same input of the non-inverting buffer. The first and second source-follower transistors may include source terminals or current-carrying terminals that are each coupled to the same output of the non-inverting buffer. In one or more embodiments, the source and drain terminals of each of the first and second source-follower transistors may be separately biased.

In one or more embodiments, each LC tank of the two-stage series resonance oscillator may include a capacitance coupled in series between the first driver stage and the second driver stage and an inductance coupled to a reference node (e.g., a shunt inductance). Herein, the term "shunt" is sometimes used to refer to a component or group of components that is coupled or connected between a signal path and a reference (e.g., ground or common) voltage or a supply voltage (e.g., VDD).

In one or more other embodiments, each LC tank of the two-stage series resonance oscillator may include an inductance coupled in series between the first driver stage and the second driver stage and a capacitance coupled to a reference node (e.g., a shunt capacitance). In one or more such embodiments, gates or control terminals of the first and second source-follower transistors of the non-inverting buffer may be biased via the inductance(s) of the LC tank disposed at the input of the non-inverting buffer. In one or more such embodiments, the inductances used to bias the gate of the first and second source follower transistors may be arranged as first and second nested inductive loops that are further nested with and electromagnetically coupled to a third inductive loop, where the output of the oscillator is provided through the third inductive loop via an output buffer.

FIG. 1 shows an illustrative circuit diagram representing a series resonance oscillator 100 (sometimes referred to herein as the "oscillator 100"), which includes a non-inverting buffer 102, an inverter 110, and inductor-capacitor (LC) tanks 103 and 105. Herein, the term "LC tank" refers to a resonant circuit that includes an inductance and a capacitance that are arranged to act as an electrical resonator, exhibiting resonant behavior at one or more resonant frequencies. In one or more embodiments, inverter 110 may be implemented as a self-biased AC-coupled inverter, a non-limiting example of which is represented by the circuitry 111. In one or more other embodiments, the inverter 110 may be implemented as a conventional inverter, and the LC tank 103 may be supplied with a bias voltage rather than a ground or reference voltage. The series resonance oscillator 100 may be voltage-driven. The series resonance oscillator 100 may include two driver stages, the non-inverting buffer 102 and the inverter 110, which may advantageously reduce current consumption and layout size (e.g., footprint) compared to conventional series resonance oscillators that require four driver stages.

The LC tank 103 may include an inductance 104 and a capacitance 108. The LC tank 105 may include an inductance 112 and a capacitance 116. The capacitances 108 and 116 may be implemented using a single capacitor or a network of two or more series-connected capacitors, parallel-connected capacitors, or a combination of series-connected and parallel-connected capacitors. The inductances 104 and 112 may be implemented using a single inductor or a network of two or more series-connected inductors, parallel-connected inductors, or a combination of series-connected and parallel-connected inductors.

In one or more embodiments, the inductance 104 is coupled between an output of the non-inverting buffer 102 and a node 106. The capacitance 108 is coupled between the node 106 and a reference node 118. That is, the capacitance 108 may be a shunt capacitance. A ground or reference voltage may be provided via the reference node 118. The node 106 is coupled to an input of the inverter 110. The inductance 112 is coupled between an output of the inverter 110 and a node 114. The capacitance 116 is coupled between the node 114 and the reference node 118. That is, the capacitance 116 may be a shunt capacitance. The node 114 is coupled to an input of the non-inverting buffer 102. Each of the inverter 110 and the non-inverting buffer 102 may have a single-ended input and a single-ended output.

The oscillator 100 may be configured to oscillate at a series resonant frequency of the LC tanks 103 and 105. The series resonant frequency of the LC tanks 103 and 105 may be determined by the capacitance values of the capacitances 108 and 116 and by the inductance values of the inductances 104 and 112. For example, the fundamental series resonant frequency $f_0$ for a given LC tank may be given as:

$$f_0 = \frac{1}{2\pi\sqrt{LC}} \tag{1}$$

where L is the inductance and C is the capacitance.

The phase relationships between the LC tanks 103 and 105 and the driver stages (the non-inverting buffer 102 and the inverter 110) may allow for sustained oscillation at the resonant frequency $f_0$. In the present example, the phase of the signal at the input of the non-inverting buffer 102 (e.g., at the node 114) is given as 0°. The signal phase at the input of the inverter 110 (e.g., at the node 106) is 270°, relative to the signal phase at the node 114, due to a −90° phase shift applied by the LC tank 103. The signal phase at the output of the inverter 110, prior to the LC tank 105, is 90°, relative to the signal phase at the node 114, due to a 180° phase shift applied by the inverter 110. The LC tank 105 applies a −90° phase shift to the signal output by the inverter 110 to bring the relative signal phase back to 0° at the node 114.

The non-inverting buffer 102 may have a sufficiently low output impedance, dependent on the Q-factor of the LC tank 103, which may allow the non-inverting buffer 102 to drive the LC tank 103 when the impedance of the LC tank 103 is low (e.g., for signals at or near the series resonant frequency $f_0$). In one or more embodiments, the output impedance of a non-inverting buffer, such as the non-inverting buffer 102, may be sufficiently low when it is less than or equal to the equivalent resistance of an LC tank at its output, such as the LC tank 103, which may allow the non-inverting buffer to deliver sufficient energy to the LC tank. For example, the equivalent resistance of the LC tank 103 may be equal to $(2\pi f_0{}^*L)/Q$, where $f_0$ is the resonant frequency, L is the inductance value of the inductance 104, and Q is the Q-factor of the LC tank 103. For example, the value of $2\pi f_0$ for the LC tank 103 may be equal to 1/sqrt (LC), where C is the capacitance value of the capacitance 108 and L is the inductance value of the inductance 104. In one or more embodiments, the Q-factor of the LC tank 103 may be 10 or greater than 10 to achieve relatively low phase noise. As a non-limiting example, given L=500 pH, C=500 fF, and Q=10, then the equivalent resistance of the LC tank 103 is around 3 Ohms (e.g., around 3.333 Ohms), and the output impedance of the non-inverting buffer 102 may be less than or equal to around 3 Ohms. In one or more embodiments, the non-inverting buffer 102 may be implemented using one or more source-follower transistor arrangements to achieve a suitable low output impedance. In one or more embodiments, the non-inverting buffer may include both a PMOS source-follower transistor and an NMOS source-follower transistor, each coupled between the input and the output of the non-inverting buffer 102, such that the output impedance of the non-inverting buffer 102 is suitably low for both rising and falling signal directions. In one or more embodiments, the PMOS and NMOS source-follower transistors may be separately biased (e.g., each receiving separate direct-current (DC) bias voltages at the respective gate terminals and separate DC bias voltages at the respective source and drain terminals), while each receiving the same high frequency (e.g., RF) signal at their respective gate terminals. An example of a non-inverting buffer that may be used to implement the non-inverting buffer 102, is shown in FIG. 2.

Figure 2:
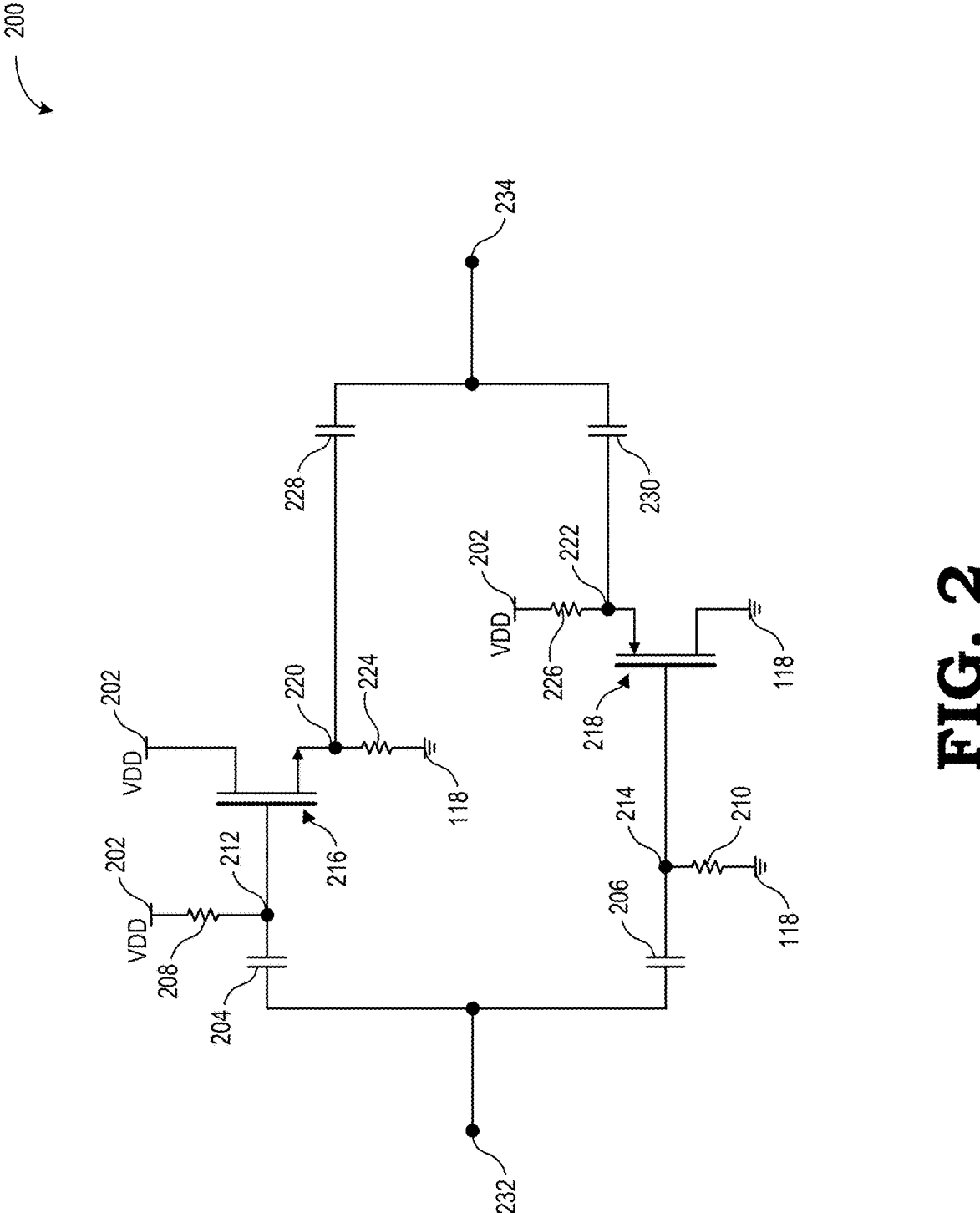
FIG. 2 shows an illustrative circuit diagram showing a non-inverting buffer, which may be used in the series resonance oscillator of FIG. 1, in accordance with various embodiments.

FIG. 2 shows an illustrative circuit diagram representing a non-inverting buffer 200 that includes two source-follower transistor arrangements having gate, drain and source terminals that are separately DC biased. The non-inverting buffer 200 may correspond to an embodiment of the non-inverting buffer 102 of FIG. 1, as a non-limiting example. In the present example, the non-inverting buffer 200 is described with reference to the oscillator 100 of FIG. 1, like reference numbers are used to denote like elements, and descriptions of such like elements are not necessarily repeated here for sake of brevity. It should be understood that the use of the non-inverting buffer 200 in the oscillator 100 of FIG. 1 is intended to be illustrative and non-limiting, such that the non-inverting buffer 200 may implemented as part of other suitable oscillators (e.g., as the non-inverting buffer 302 in the oscillator 300 of FIG. 3), in accordance with one or more other embodiments.

As shown, the non-inverting buffer 200 may include capacitances 204, 206, 228, and 230, resistances 208, 210, 224, and 226, transistors 216 and 218, an input node 232, and an output node 234. The capacitances 204 and 228, the resistances 208 and 224, and the transistor 216 may be included in or connected to a first path that is connected between the input node 232 and the output node 234. The capacitances 206 and 230, the resistances 210 and 226, and the transistor 218 may be connected to or included in a second path that is connected between the input node 232 and the output node 234. The first path and the second path may be connected in parallel between the input node 232 and the output node 234, as shown.

In the first path, the capacitance 204 may be coupled between the input node 232 and a node 212. The node 212 may correspond to or may be coupled to a gate terminal of the transistor 216. The resistance 208 may be coupled between a voltage source 202 (e.g., which may provide a supply voltage VDD) and the node 212. A drain terminal of the transistor 216 may be coupled to the voltage source 202. The resistance 224 may be coupled between a node 220 and the reference node 118 (e.g., which may provide a ground or reference voltage). The node 220 may correspond to or may be coupled to a source terminal of the transistor 216. The capacitance 228 may be coupled between the node 220 and the output node 234.

In the second path, the capacitance 206 may be coupled between the input node 232 and a node 214. The node 214 may correspond to or may be coupled to a gate terminal of the transistor 218. The resistance 210 may be coupled between the node 214 and the reference node 118. A drain terminal of the transistor 218 may be coupled to the reference node 118. The resistance 226 may be coupled between the voltage source 202 and a node 222. The node 222 may correspond to or may be coupled to a source terminal of the transistor 218. The capacitance 230 may be coupled between the node 222 and the output node 234. While the terms "gate terminal", "drain terminal", and "source terminal" are sometimes used when describing transistors herein, it should be understood that a "gate terminal" of a transistor is an example of a "control terminal," and a "drain terminal" and a "source terminal" of a transistor are examples of "current-carrying terminals."

The capacitances 204 and 206 may provide DC and low-frequency signal blocking between the input node 232 and the gate terminals of the transistors 216 and 218. The capacitances 228 and 230 may provide DC and low-frequency signal blocking between the output node 234 and the source terminals of the transistors 216 and 218 allowing for independent DC-voltages at the source nodes 220 of transistor 216 and 222 of transistor 218.

The DC bias voltage provided via the resistor 208 to the gate terminal of the transistor 216 may be set based on the DC voltage VDD. The DC bias voltage provided to the drain terminal of the transistor 216 may be the DC voltage VDD.

The DC bias voltage provided to the gate terminal of the transistor 218 may be determined based on the reference voltage provided via resistor 210 from the reference node 118. The DC bias voltage provided at the source terminal of the transistor 218 may be the reference voltage provided via the reference node 118. In this way, the gate terminals of the transistors 216 and 218 are separately DC-biased and the respective source and drain terminals of the transistors 216 and 218 are separately DC-biased. While the same reference voltages and supply voltages (VDD) are shown to be supplied at the nodes 118 and 202, respectively, in the present example, it should be understood that such an arrangement is intended to be illustrative and non-limiting. For example, in one or more other embodiments, one or more of the nodes 202 may be supplied with a supply voltage that is different from one or more other supply voltages that are supplied to the other nodes 202, and one or more of the nodes 118 may be supplied with a reference voltage that is different from one or more other reference voltages that are supplied to the other nodes 118.

In one or more embodiments, the transistor 216 may be an NMOS transistor and the transistor 218 may be a PMOS transistor. In or more embodiments, the transistor 216 may be arranged as an NMOS source-follower and the transistor 218 may be arranged as a PMOS source-follower. For example, a source-follower transistor may have a source voltage that follows (to a certain extent) its gate voltage. Generally, a source-follower transistor may decouple a load from the gate of the source-follower transistor, and the source terminal may provide the load current. By implementing the transistors 216 and 218 as source-follower NMOS and PMOS transistors in the illustrated arrangement, the non-inverting buffer 200 may maintain a low output impedance both when the magnitude of an input signal (e.g., an RF input signal) received at the input node 232 is rising and when the magnitude of the input signal is falling. For example, the transistor 216 may provide low output impedance during periods in which the input signal rises, and the transistor 218 may provide low output impedance during periods in which the input signal falls, in one or more such embodiments. In this way the transistors 216 and 218 may provide suitably low output impedance (e.g., suitable for use in a series resonance oscillator) for the non-inverting buffer 200 for both rising and falling signal directions. While one or more embodiments of the present example implement the transistors 216 and 218 as PMOS and NMOS transistors, this is intended to be illustrative and non-limiting. In one or more other embodiments, the transistors 216 and 218 may instead be implemented as two bipolar junction transistors (BJTs), or as a BJT and a MOSFET (e.g., with the transistor 216 implemented as an NPN bipolar emitter follower and the transistor 218 being implemented as a PMOS source-follower, as a non-limiting example).

Figure 3:
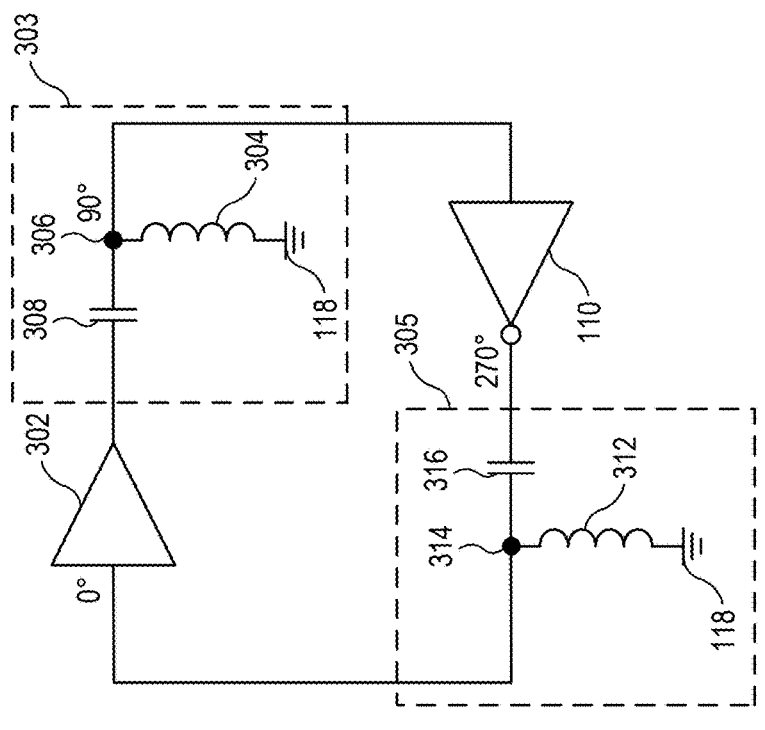
FIG. 3 shows an illustrative circuit diagram showing a series resonance oscillator that includes two LC tanks, an inverter, and a non-inverting buffer, in accordance with various embodiments.

In one or more embodiments, the placement of capacitances and inductances in the LC tanks of a series resonance oscillator may be swapped (e.g., relative to the arrangement shown in FIG. 1), which may allow at least one LC tank inductance to be used for DC-biasing of a non-inverting buffer of the oscillator. For example, FIG. 3 shows an illustrative circuit diagram representing a series resonance oscillator 300 (sometimes referred to herein as the "oscillator 300"), which includes a non-inverting buffer 302, inductor-capacitor (LC) tanks 303 and 305, and an inverter 110. One or more elements of the oscillator 300 may be similar to corresponding elements of the oscillator 100 of FIG. 1 (e.g., the reference node 118 and the inverter 110), and like reference numbers are used to denote like elements in the present example. The series resonance oscillator 300 may be voltage-driven. The series resonance oscillator 300 may include two driver stages, the non-inverting buffer 302 and the inverter 110, which may advantageously reduce current consumption and layout size (e.g., footprint) compared to conventional series resonance oscillators that require four driver stages.

The LC tank 303 may include an inductance 304 and a capacitance 308. The LC tank 305 may include an inductance 312 and a capacitance 316. The capacitances 308 and 316 may be implemented using a single capacitor or a network of two or more series-connected capacitors, parallel-connected capacitors, or a combination of series-connected and parallel-connected capacitors. The inductances 304 and 312 may be implemented using a single inductor or a network of two or more series-connected inductors, parallel-connected inductors, or a combination of series-connected and parallel-connected inductors.

In one or more embodiments, the capacitance 308 is coupled between an output of the non-inverting buffer 302 and a node 306. The inductance 304 is coupled between the node 306 and a reference node 118. That is, the inductance 304 may be a shunt inductance. A ground or reference voltage may be provided via the reference node 118. The node 306 is coupled to an input of the inverter 110. The capacitance 316 is coupled between an output of the inverter 110 and a node 314. The inductance 312 is coupled between the node 314 and the reference node 118. That is, the inductance 312 may be a shunt inductance. The node 314 is coupled to an input of the non-inverting buffer 302.

The oscillator 300 may be configured to oscillate at a series resonant frequency $f_0$ of the LC tanks 303 and 305. The series resonant frequency $f_0$ of the LC tanks 303 and 305 may be determined by the capacitance values of the capacitances 308 and 316 and by the inductance values of the inductances 304 and 312 (e.g., in accordance with Equation 1, above).

The phase relationships between the LC tanks 303 and 305 and the driver stages (the non-inverting buffer 302 and the inverter 110) may allow for sustained oscillation at the resonant frequency $f_0$. In the present example, the phase of the signal at the input of the non-inverting buffer 302 (e.g., at the node 314) is given as 0°. The signal phase at the input of the inverter 110 (e.g., at the node 3) is 90°, relative to the signal phase at the node 314, due to a +90° phase shift applied by the LC tank 303. The signal phase at the output of the inverter 110, prior to the LC tank 305, is 270°, relative to the signal phase at the node 314, due to a 180° phase shift applied by the inverter 110. The LC tank 305 applies a +90° phase shift to the signal output by the inverter 110 to bring the relative signal phase back to 0° at the node 314.

The non-inverting buffer 302 may have a sufficiently low output impedance, dependent on the Q-factor of the LC-tank 303, which may allow the non-inverting buffer 302 to drive the LC tank 303 when the impedance of the LC tank 303 is low (e.g., for signals at or near the series resonant frequency $f_0$). For example, a sufficiently low output impedance for the non-inverting buffer 302 may be one that is less than or equal to the Q-factor-dependent equivalent resistance of the LC-tank 303, similar to the example described above in connection with FIG. 1. In one or more embodiments, the non-inverting buffer 302 may be implemented using one or more source-follower transistor arrangements to achieve a suitable low output impedance. In one or more embodiments, the non-inverting buffer may include both a PMOS source-follower transistor and an NMOS source-follower transistor, each coupled between the input and the output of the non-inverting buffer 302, such that the output impedance of the non-inverting buffer 302 is suitably low for both rising and falling signal directions. In one or more embodiments, the PMOS and NMOS source-follower transistors may be separately biased (e.g., each receiving separate direct-current (DC) bias voltages at the respective gate terminals and separate DC bias voltages at the respective source and drain terminals), while each receiving the same high frequency (e.g., RF) signal at their respective gate terminals. As a non-limiting example, the non-inverting buffer 302 may be implemented using either of the non-inverting buffer 200 of FIG. 2 or the non-inverting buffer 500 of FIG. 5, in accordance with various embodiments.

Figure 4:
FIG. 4 shows an illustrative circuit diagram showing a series resonance oscillator that includes two LC tanks, an inverter, and a non-inverting buffer, with portions of the LC tanks being split between parallel paths at the inputs and outputs of the non-inverting buffer, in accordance with various embodiments.
Figure 4:
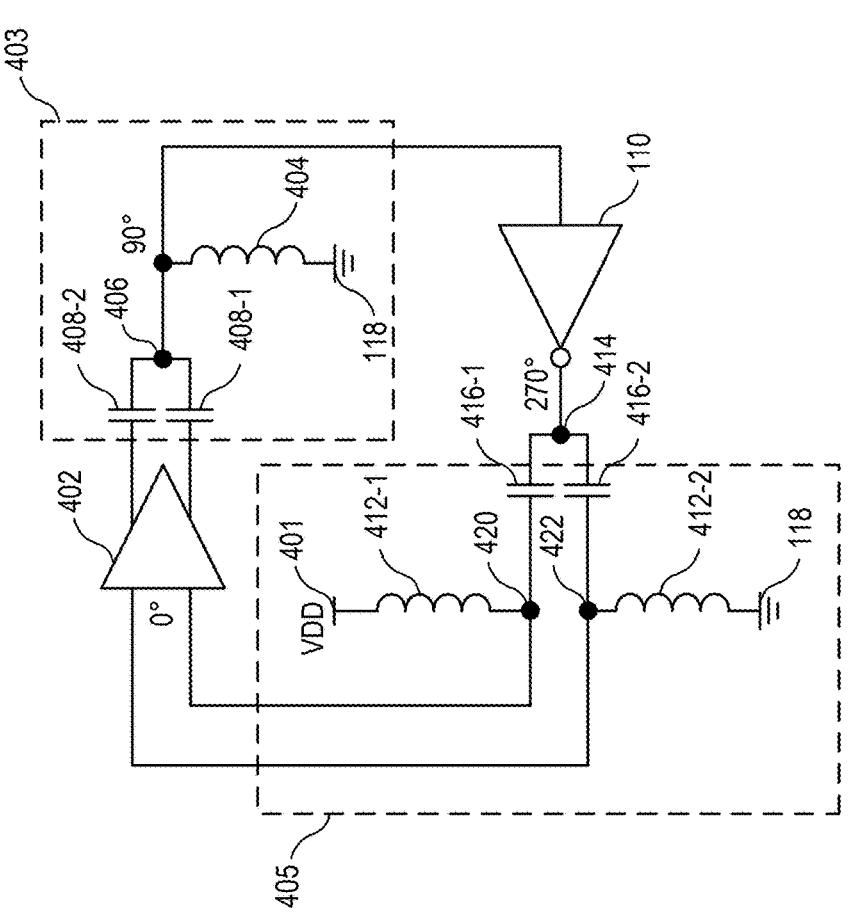

FIG. 4 shows an illustrative circuit diagram representing a series resonance oscillator 400 (sometimes referred to herein as the "oscillator 400"), which includes a non-inverting buffer 402, the inverter 110, and the inductor-capacitor (LC) tanks 403 and 405. One or more elements of the oscillator 400 may be similar to corresponding elements of the oscillator 100 of FIG. 1 (e.g., the reference node 118 and the inverter 110), and like reference numbers are used to denote like elements in the present example. The series resonance oscillator 400 may be voltage-driven. The series resonance oscillator 400 may include two driver stages, the non-inverting buffer 402 and the inverter 110, which may advantageously reduce current consumption and layout size (e.g., footprint) compared to conventional series resonance oscillators that require four driver stages.

The LC tank 403 may include an inductance 404 and capacitances 408-1 and 408-2. The LC tank 405 may include inductances 412-1 and 412-2 and capacitances 416-1 and 416-2. The capacitances 408-1, 408-2, 416-1, and 416-2 may be implemented, respectively, using a single capacitor or a network of two or more series-connected capacitors, parallel-connected capacitors, or a combination of series-connected and parallel-connected capacitors. The inductances 404, 412-1, and 412-2 may be implemented, respectively, using a single inductor or a network of two or more series-connected inductors, parallel-connected inductors, or a combination of series-connected and parallel-connected inductors.

In one or more embodiments, the capacitances 408-1 and 408-2 is coupled between respective outputs of the non-inverting buffer 402 and a node 406. The inductance 404 is coupled between the node 406 and a reference node 118. That is, the inductance 404 may be a shunt inductance. A ground or reference voltage may be provided via the reference node 118. The node 406 is coupled to an input of the inverter 110. The capacitance 416-1 is coupled between an output of the inverter 110 (i.e., node 414) and a node 420. The capacitance 416-2 is coupled between the output of the inverter 110 (i.e., node 414) and a node 422. The inductance 412-1 is coupled between a voltage source 401 (e.g., which may provide a supply voltage VDD) and the node 420. The inductance 412-2 is coupled between the node 422 and the reference node 118. That is, the inductances 412-2 and 412-1 may be shunt inductances. The node 420 is coupled to a first input of the non-inverting buffer 402. The node 422 is coupled to a second input of the non-inverting buffer 402.

In one or more embodiments, the node 414 may correspond to an input of the non-inverting buffer 402 (e.g., with the LC tank 405 being considered part of the non-inverting buffer 402 in one or more such embodiments), the node 406 may correspond to an output of the non-inverting buffer 402 (e.g., with the capacitances 408-1 and 408-2 being considered part of both the non-inverting buffer 402 and the LC tank 403 in one or more such embodiments). In one or more embodiments, gate terminals of transistors of the non-inverting buffer 402 may be DC-biased via the inductances 412-1 and 412-2, while the inductances 412-1 and 412-2 simultaneously function as inductive elements of the LC tank 405. The capacitances 408-1, 408-2, 416-1, and 416-2 may provide DC blocking for the non-inverting buffer 402, while the capacitances 408-1, 408-2, 416-1, and 416-2 simultaneously function as capacitive elements of the LC tanks 403 and 405.

The oscillator 400 may be configured to oscillate at a series resonant frequency $f_0$ of the LC tanks 403 and 405. The series resonant frequency $f_0$ of the LC tanks 403 and 405 may be determined by the capacitance values of the capacitances 408-1, 408-2, 416-1, and 416-2 and by the inductance values of the inductances 404, 412-1 and 412-2.

The phase relationships between the LC tanks 403 and 405 and the driver stages (the non-inverting buffer 402 and the inverter 110) may allow for sustained oscillation at the resonant frequency $f_0$. These phase relationships may be similar to those described above in connection with FIG. 3 (e.g., 0° at the input of the non-inverting buffer 402, 90° at the input of the inverter 110, and 270° at the output of the inverter 110), and the description of such phase relationships are not repeated here for sake of brevity.

The non-inverting buffer 402 may have a sufficiently low output impedance, dependent on the Q-factor of the LC-tank 303, which may allow the non-inverting buffer 402 to drive the LC tank 403 when the impedance of the LC tank 403 is low (e.g., for signals at or near the series resonant frequency $f_0$). For example, a sufficiently low output impedance for the non-inverting buffer 402 may be one that is less than or equal to the Q-factor-dependent equivalent resistance of the LC-tank 403, similar to the example described above in connection with FIG. 1. In one or more embodiments, the non-inverting buffer 402 may be implemented using one or more source-follower transistor arrangements to achieve a suitable low output impedance. In one or more embodiments, the non-inverting buffer may include both a PMOS source-follower transistor and an NMOS source-follower transistor, each coupled between the input and the output of the non-inverting buffer 402, such that the output impedance of the non-inverting buffer 402 is suitably low for both rising and falling signal directions. In one or more embodiments, the PMOS and NMOS source-follower transistors may be separately biased (e.g., each receiving separate direct-current (DC) bias voltages at the respective gate terminals and separate DC bias voltages at the respective source and drain terminals), while each receiving the same high frequency (e.g., RF) signal at their respective gate terminals. As a non-limiting example, the non-inverting buffer 402 may be implemented using the non-inverting buffer circuitry 500 of FIG. 5, in accordance with various embodiments.

Figure 5:
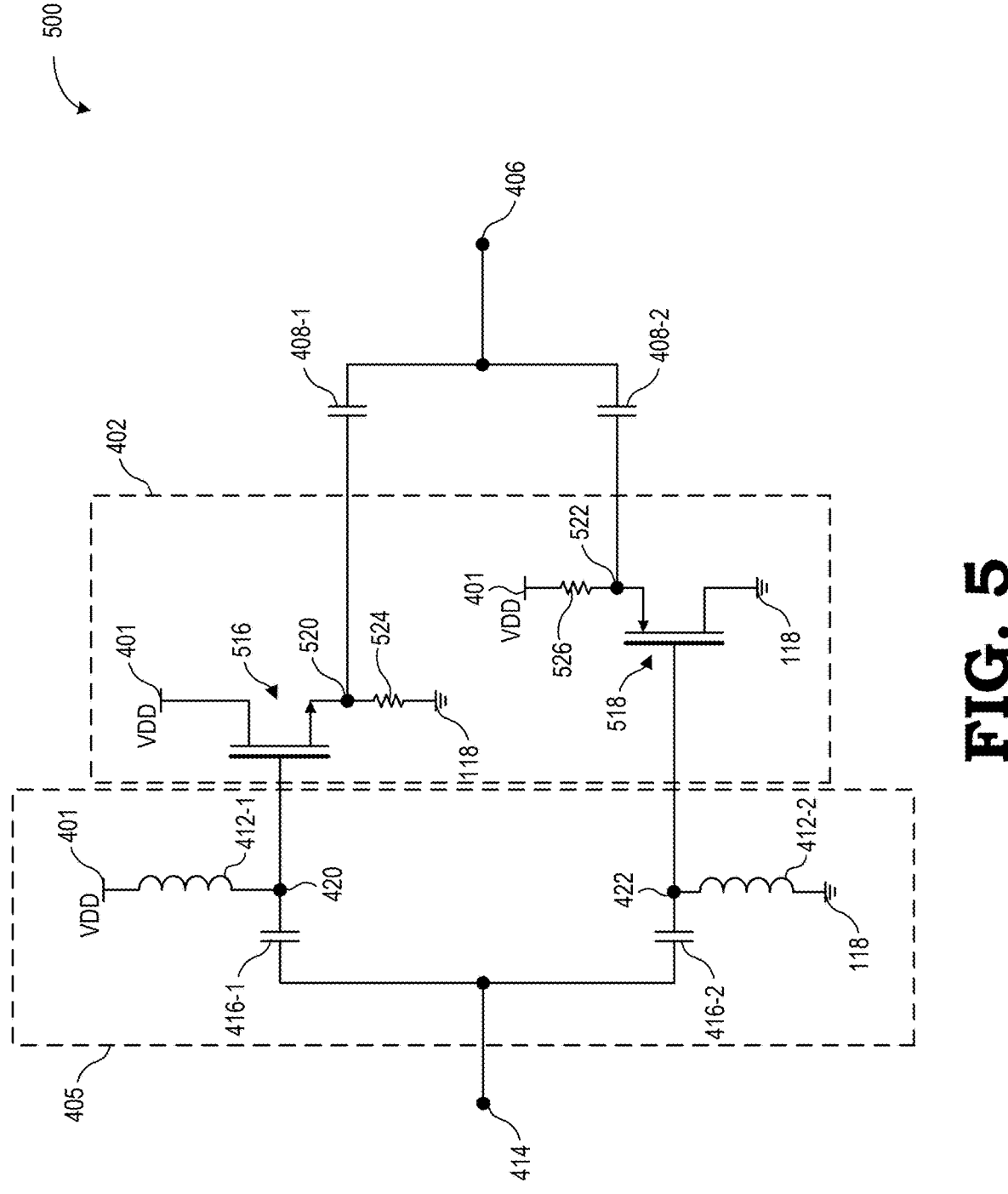
FIG. 5 shows an illustrative circuit diagram showing non-inverting buffer circuitry, which may be used in the series resonance oscillator of FIG. 3 or FIG. 4, in accordance with various embodiments.

FIG. 5 shows an illustrative circuit diagram representing non-inverting buffer circuitry 500 that includes two source-follower transistor arrangements that are separately DC biased. The non-inverting buffer circuitry 500 may include an embodiment of the non-inverting buffer 402 of FIG. 4, as a non-limiting example. In the present example, the non-inverting buffer circuitry 500 is described with reference to the oscillator 400 of FIG. 4, like reference numbers are used to denote like elements, and descriptions of such like elements are not necessarily repeated here for sake of brevity. It should be understood that the use of the non-inverting buffer circuitry 500 in the oscillator 400 of FIG. 4 is intended to be illustrative and non-limiting, such that the non-inverting buffer circuitry 500 may implemented as part of other suitable oscillators, in accordance with one or more other embodiments.

As shown, the non-inverting buffer circuitry 500 may include capacitances 416-1, 416-2, 408-1, and 408-2, resistances 524 and 526, inductances 412-1 and 412-2, transistors 516 and 518, an input node 414, and an output node 406. The capacitances 416-1 and 408-1, the resistance 524, the inductance 412-1, and the transistor 516 may be included in or connected to a first path that is connected between the input node 414 and the output node 406. The capacitances 416-2 and 408-2, the resistance 526, the inductance 412-2, and the transistor 518 may be connected to or included in a second path that is connected between the input node 414 and the output node 406. The first path and the second path may be connected in parallel between the input node 414 and the output node 406, as shown.

In the first path, the capacitance 416-1 may be coupled between the input node 414 and a node 420. The node 420 may correspond to or may be coupled to a gate terminal of the transistor 516. The inductance 412-1 may be coupled between a voltage source 401 (e.g., which may provide a supply voltage VDD) and the node 420. A drain terminal of the transistor 516 may be coupled to the voltage source 401. The resistance 524 may be coupled between a node 520 and the reference node 118 (e.g., which may provide a ground or reference voltage). The node 520 may correspond to or may be coupled to a source terminal of the transistor 516. The capacitance 408-1 may be coupled between the node 520 and the output node 406.

In the second path, the capacitance 416-2 may be coupled between the input node 414 and a node 422. The node 422 may correspond to or may be coupled to a gate terminal of the transistor 518. The inductance 412-2 may be coupled between the node 422 and the reference node 118. A drain terminal of the transistor 518 may be coupled to the reference node 118. The resistance 526 may be coupled between the voltage source 401 and a node 522. The node 522 may correspond to or may be coupled to a source terminal of the transistor 518. The capacitance 408-2 may be coupled between the node 522 and the output node 406.

The capacitances 416-1 and 416-2 may provide DC and low-frequency signal blocking between the input node 414 and the gate terminals of the transistors 516 and 518. In one or more embodiments, the capacitances 416-1 and 416-2 may additionally function as capacitive elements of an LC tank 405. The capacitances 408-1 and 408-2 may provide DC and low-frequency signal blocking between the output node 406 and the source terminals of the transistors 516 and 518 and they allow for independent DC voltages at the source nodes 520 and 522 of transistors 516 and 518. In one or more embodiments, the capacitances 408-1 and 408-2 may additionally function as capacitive elements of an LC tank (e.g., the LC tank 403 of FIG. 4).

The DC bias voltage provided via inductor 412-1 to the gate terminal of the transistor 516 may be set based on the DC voltage VDD. The DC bias voltage provided to the drain terminal of the transistor 516 may be the DC voltage VDD. The DC bias voltage provided via inductor 412-2 to the gate terminal of the transistor 518 may be determined based on the reference voltage provided via the reference node 118. The DC bias voltage provided at the drain terminal of the transistor 518 may be the reference voltage provided via the reference node 118. In this way, the gate terminals of the transistors 516 and 518 are separately DC-biased, the source terminals of the transistors 516 and 518 are separately DC-biased and the drain terminals of the transistors 516 and

518 are separately DC-biased. By using inductors to provide DC-biasing to the gates of the transistors 516 and 518 in the non-inverting buffer circuitry 500, phase noise may be further reduced compared to resistor-based DC-biasing. In one or more embodiments, the inductances 412-1 and 412-2 may additionally function as inductive elements of the LC tank 405. While the same reference voltages and supply voltages (VDD) are shown to be supplied at the nodes 118 and 401, respectively, in the present example, it should be understood that such an arrangement is intended to be illustrative and non-limiting. For example, in one or more other embodiments, one or more of the nodes 401 may be supplied with a supply voltage that is different from one or more other supply voltages that are supplied to the other nodes 401, and one or more of the nodes 118 may be supplied with a reference voltage that is different from one or more other reference voltages that are supplied to the other nodes 118.

In one or more embodiments of the non-inverting buffer 402, the transistor 516 may be an NMOS transistor and the transistor 518 may be a PMOS transistor. In or more embodiments, the transistor 516 may be arranged as an NMOS source-follower and the transistor 518 may be arranged as a PMOS source-follower. By implementing the transistors 516 and 518 as source-follower NMOS and PMOS transistors in the illustrated arrangement, non-inverting buffer 500 may maintain a low output impedance both when the input signal (e.g., an RF input signal) received at the input node 414 is rising and when the input signal is falling. For example, the transistor 516 may provide low output impedance during periods in which the input signal rises, and the transistor 518 may provide low output impedance during periods in which the input signal falls, in one or more such embodiments. In this way the transistors 516 and 518 may provide suitably low output impedance (e.g., suitable for use in a series resonance oscillator) for the non-inverting buffer 402 for both rising and falling signal directions. While one or more embodiments of the present example implement the transistors 516 and 518 as PMOS and NMOS transistors, this is intended to be illustrative and non-limiting. In one or more other embodiments, the transistors 516 and 518 may instead be implemented as two bipolar junction transistors (BJTs), or as a BJT and a MOSFET (e.g., with the transistor 516 implemented as an NPN bipolar emitter follower and the transistor 518 being implemented as a PMOS source-follower, as a non-limiting example).

Figure 6:
FIG. 6 shows an illustrative diagram showing an arrangement of nested inductive loops, which may be used to implement LC tank inductances and an output of the series resonance oscillator of FIG. 4 or FIG. 5, in accordance with various embodiments.
Figure 6:
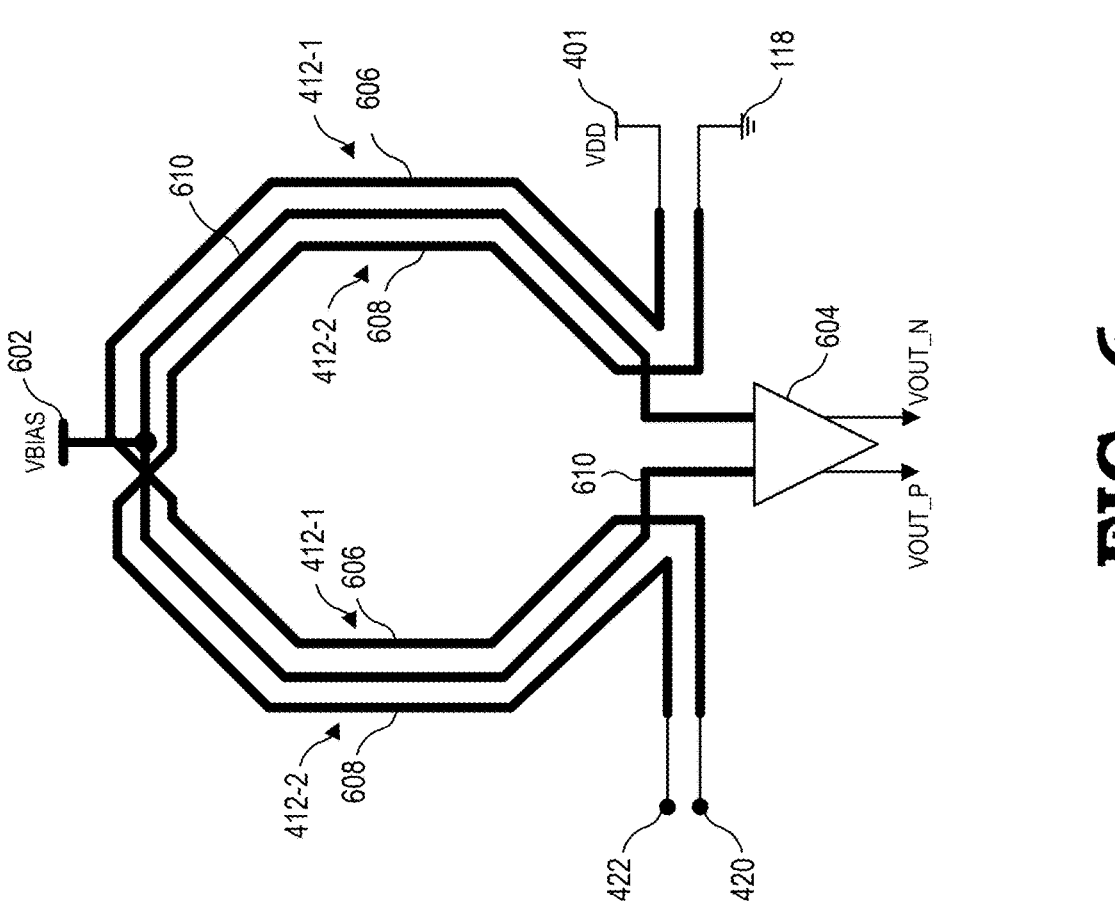

FIG. 6 shows an illustrative diagram of circuitry 600, which includes nested inductive loops 606, 608, and 610 that are arranged to provide one or more outputs of a series resonance oscillator. The circuitry 600 is described with reference to the series resonance oscillator 400 of FIG. 4, with like reference numerals denoting like elements.

In one or more embodiments, for example, the nested inductive loops of the circuitry 600 include embodiments of the inductances 412-1 and 412-2 of the series resonance oscillator 400 of FIG. 4. For example inductance 412-1 may be implemented as a first inductive loop 606, the inductance 412-2 may be implemented as a second inductive loop 608, and a third inductive loop 610 may be electromagnetically (e.g., inductively) coupled to the first and second inductive loops 608 and 610.

The first inductive loop 606 may be coupled between the node 420 and the voltage source 401. The second inductive loop 608 may be coupled between the node 422 and the reference node 118. The third inductive loop may be coupled between first and second inputs of an output buffer 604. The output buffer 604 may provide differential output signals VOUT_P and VOUT_N, which may correspond to outputs of a series resonance oscillator (e.g., the series resonance oscillator 400 of FIG. 4) that includes the inductive loops 606, 608, and 610. A voltage source 602 may be coupled to the center point of the third inductive loop 610 (e.g., via a center tap), and may provide a bias voltage VBIAS to the third inductive loop 610. In one or more embodiments, VBIAS may be approximately (e.g., within +/−10% of) half of the supply voltage VDD provided by the voltage source 401. The bias voltage VBIAS may define the common mode in one or more embodiments.

In one or more embodiments, the inductive loops 606, 608, and 610 may be formed from respectively different metal layers of a circuit board or die, as a non-limiting example. In one or more embodiments, the inductance and resistance of the third inductive loop 610 may be different from the inductances and resistances of the first and second inductive loops 606 and 608, at least because the third inductive loop 610 may have a lower quality factor ("Q-factor") than the first and second inductive loops 606 and 608.

Referring back to FIG. 4, in one or more embodiments, during operation of the oscillator 400, the signal phases at the node 406 and the node 414 may not be perfectly aligned to 90° and 270°, respectively, due to non-idealities and differences of the buffer 402 or the inverter 110 such as delay or signal amplitude or clipping, as non-limiting examples. Differential output signals taken directly from the nodes 406 and 414 may be difficult to align, due at least in part to these non-idealities. Returning to FIG. 6, to address this challenge, differential output signals VOUT_P and VOUT_N may instead be provided via the output buffer 604 and the nested inductive loops 606, 608, and 610 for improved alignment. For example, the oscillating signal at the output of the inverter 110 may drive corresponding oscillations through the inductive loops 606 and 608 (e.g., the inductances 414-1 and 414-2), which may cause oscillation in the third inductive loop 610, based upon which the output buffer 604 may generate the differential output signals VOUT_P and VOUT_N.

Various exemplary embodiments are presented below. Some simplifications and omissions may be made in the following examples, which are intended to highlight and introduce some aspects of the various exemplary embodiments, without limiting the scope.

In an example embodiment, an oscillator includes an inverter including a first input and a first output, non-inverting buffer circuitry including a second input, a second output, a first transistor having a first gate terminal and a first source terminal, and a second transistor having a second gate terminal and a second source terminal, a first inductor-capacitor (LC) tank coupled between the first input of the inverter and the second output of the non-inverting buffer circuitry, and a second LC tank coupled between the first output of the inverter and the second input of the non-inverting buffer circuitry, where the first gate terminal of the first transistor is coupled to the second input of the non-inverting buffer circuitry, the second gate terminal of the second transistor is coupled to the second input of the non-inverting buffer circuitry, the first source terminal of the first transistor is coupled to the second output of the non-inverting buffer circuitry, the second source terminal of the second transistor is coupled to the second output of the non-inverting buffer circuitry, the first source terminal and the second source terminal are separately direct-current (DC)-biased, and the first gate terminal and the second gate terminal are separately DC-biased.

In one or more embodiments, the first transistor is an n-type metal oxide semiconductor (NMOS) transistor, and the second transistor is a p-type metal oxide semiconductor (PMOS) transistor.

In one or more embodiments, the non-inverting buffer circuitry further includes a first resistance coupled between a reference node and the first source terminal of the first transistor, where the first source terminal is DC-biased via the first resistance, and a second resistance coupled between a voltage source the second source terminal of the second transistor, where the second source terminal is DC-biased via the second resistance.

In one or more embodiments, the non-inverting buffer circuitry further includes a first resistance coupled between a voltage source and the first gate terminal of the first transistor, where the first gate terminal is DC-biased via the first resistance, and a second resistance coupled between a reference node and the second gate terminal of the second transistor, where the second gate terminal is DC-biased via the second resistance.

In one or more embodiments, the non-inverting buffer circuitry further includes a first inductance coupled between a voltage source and the first gate terminal of the first transistor, where the first gate terminal is DC-biased via the first inductance, and a second inductance coupled between a reference node the second gate terminal of the second transistor, where the second gate terminal is DC-biased via the second inductance.

In one or more embodiments, the second LC tank includes the first inductance and the second inductance.

In one or more embodiments, the non-inverting buffer circuitry further includes a first capacitance coupled between the second input of the non-inverting buffer circuitry and the first gate terminal of the first transistor, a second capacitance coupled between the second input of the non-inverting buffer circuitry and the second gate terminal of the second transistor, a third capacitance coupled between the second output of the non-inverting buffer circuitry and the first source terminal of the first transistor, and a fourth capacitance coupled between the second output of the non-inverting buffer circuitry and the second source terminal of the second transistor.

In one or more embodiments, the second LC tank further includes the first capacitance and the second capacitance, and the first LC tank includes the third capacitance and the fourth capacitance.

In one or more embodiments, the oscillator further includes a first inductive loop corresponding to the first inductance, a second inductive loop corresponding to the second inductance, and a third inductive loop that is electromagnetically coupled to the first inductive loop and the second inductive loop.

In one or more embodiments, the oscillator further includes an output buffer coupled to the third inductive loop and configured to provide differential output signals for the oscillator based on signals received from the third inductive loop.

In an example embodiment, a series resonance oscillator includes an inverter, non-inverting buffer circuitry including a first transistor having a first control terminal and a first current-carrying terminal, and a second transistor having a second control terminal and a second current-carrying terminal, where the first and second control terminals are separately direct-current (DC)-biased and the first and second current-carrying terminals are separately DC-biased, a first inductor-capacitor (LC) tank coupled between the inverter and the non-inverting buffer circuitry, and a second LC tank coupled between the inverter and the non-inverting buffer circuitry.

In one or more embodiments, the first transistor is an n-type metal oxide semiconductor (NMOS) transistor, and the second transistor is a p-type metal oxide semiconductor (PMOS) transistor.

In one or more embodiments, the non-inverting buffer circuitry further includes a first resistance coupled between a reference node and the first current-carrying terminal of the first transistor, where the first current-carrying terminal is DC-biased via the first resistance, and a second resistance coupled between a voltage source the second current-carrying terminal of the second transistor, where the second current-carrying terminal is DC-biased via the second resistance.

In one or more embodiments, the non-inverting buffer circuitry further includes a third resistance coupled between the voltage source and the first control terminal of the first transistor, where the first control terminal is DC-biased via the third resistance, and a fourth resistance coupled between the reference node the second control terminal of the second transistor, where the second control terminal is DC-biased via the fourth resistance.

In one or more embodiments, the non-inverting buffer circuitry further includes a first inductance coupled between the voltage source and the first control terminal of the first transistor, where the first control terminal is DC-biased via the first inductance, and a second inductance coupled between the reference node the second control terminal of the second transistor, where the second control terminal is DC-biased via the second inductance.

In one or more embodiments, the second LC tank includes the first inductance and the second inductance.

In one or more embodiments, the non-inverting buffer circuitry further includes a first capacitance coupled between an input of the non-inverting buffer circuitry and the first control terminal of the first transistor, a second capacitance coupled between the input of the non-inverting buffer circuitry and the second control terminal of the second transistor, a third capacitance coupled between an output of the non-inverting buffer circuitry and the first current-carrying terminal of the first transistor, and a fourth capacitance coupled between the output of the non-inverting buffer circuitry and the second current-carrying terminal of the second transistor.

In one or more embodiments, the second LC tank further includes the first capacitance and the second capacitance, and the first LC tank includes the third capacitance and the fourth capacitance.

In one or more embodiments, the series resonance oscillator further includes a first inductive loop corresponding to the first inductance, a second inductive loop corresponding to the second inductance, and a third inductive loop that is electromagnetically coupled to the first inductive loop and the second inductive loop.

In one or more embodiments, the series resonance oscillator further includes an output buffer coupled to the third inductive loop and configured to provide differential output signals for the series resonance oscillator based on signals received from the third inductive loop.

As used herein the terms "circuit" and "circuitry," including the term "processing circuitry" and related terminology means any suitable combination(s) of analog or digital circuit elements, hardware, firmware, software, and the like; including but not limited to, application-specific integrated circuits (ASICs), field programmable gate arrays (FPGAs), microcontrollers, and microprocessors. It will be understood that the term "circuitry" encompasses nonvolatile and volatile memory devices including, but not limited to random access memory (RAM), read-only memory (ROM), and the like, which can be implemented using any suitable devices, such as SRAM, DRAM, or magnetic storage devices as non-limiting examples.

While at least one exemplary embodiment has been presented in the foregoing detailed description, it should be appreciated that a vast number of variations exist. It should also be appreciated that exemplary embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An oscillator comprising:
   an inverter comprising a first input and a first output;
   non-inverting buffer circuitry comprising:
      a second input;
      a second output;
      a first transistor having a first gate terminal and a first source terminal; and
      a second transistor having a second gate terminal and a second source terminal;
   a first inductor-capacitor (LC) tank coupled between the first input of the inverter and the second output of the non-inverting buffer circuitry; and
   a second LC tank coupled between the first output of the inverter and the second input of the non-inverting buffer circuitry, wherein
      the first gate terminal of the first transistor is coupled to the second input of the non-inverting buffer circuitry,
      the second gate terminal of the second transistor is coupled to the second input of the non-inverting buffer circuitry,
      the first source terminal of the first transistor is coupled to the second output of the non-inverting buffer circuitry,
      the second source terminal of the second transistor is coupled to the second output of the non-inverting buffer circuitry,
      the first source terminal and the second source terminal are separately direct-current (DC)-biased, and
      the first gate terminal and the second gate terminal are separately DC-biased.

2. The oscillator of claim 1, wherein the first transistor is an n-type metal oxide semiconductor (NMOS) transistor, and the second transistor is a p-type metal oxide semiconductor (PMOS) transistor.

3. The oscillator of claim 1, wherein the non-inverting buffer circuitry further includes:
   a first resistance coupled between a reference node and the first source terminal of the first transistor, wherein the first source terminal is DC-biased via the first resistance; and
   a second resistance coupled between a voltage source the second source terminal of the second transistor, wherein the second source terminal is DC-biased via the second resistance.

4. The oscillator of claim 1, wherein the non-inverting buffer circuitry further includes:

a first resistance coupled between a voltage source and the first gate terminal of the first transistor, wherein the first gate terminal is DC-biased via the first resistance; and a second resistance coupled between a reference node and the second gate terminal of the second transistor, wherein the second gate terminal is DC-biased via the second resistance.

5. The oscillator of claim 1, wherein the non-inverting buffer circuitry further includes:

a first inductance coupled between a voltage source and the first gate terminal of the first transistor, wherein the first gate terminal is DC-biased via the first inductance; and a second inductance coupled between a reference node the second gate terminal of the second transistor, wherein the second gate terminal is DC-biased via the second inductance.

6. The oscillator of claim 5, wherein the second LC tank includes the first inductance and the second inductance.

7. The oscillator of claim 6, wherein the non-inverting buffer circuitry further comprises:

a first capacitance coupled between the second input of the non-inverting buffer circuitry and the first gate terminal of the first transistor;

a second capacitance coupled between the second input of the non-inverting buffer circuitry and the second gate terminal of the second transistor;

a third capacitance coupled between the second output of the non-inverting buffer circuitry and the first source terminal of the first transistor; and a fourth capacitance coupled between the second output of the non-inverting buffer circuitry and the second source terminal of the second transistor.

8. The oscillator of claim 7, wherein the second LC tank further includes the first capacitance and the second capacitance, and the first LC tank includes the third capacitance and the fourth capacitance.

9. The oscillator of claim 6, further comprising:

a first inductive loop corresponding to the first inductance;

a second inductive loop corresponding to the second inductance; and a third inductive loop that is electromagnetically coupled to the first inductive loop and the second inductive loop.

10. The oscillator of claim 9, further comprising:

an output buffer coupled to the third inductive loop and configured to provide differential output signals for the oscillator based on signals received from the third inductive loop.

11. A series resonance oscillator comprising:

an inverter;

non-inverting buffer circuitry comprising:

a first transistor having a first control terminal and a first current-carrying terminal; and a second transistor having a second control terminal and a second current-carrying terminal, wherein the first and second control terminals are separately direct-current (DC)-biased and the first and second current-carrying terminals are separately DC-biased;

a first inductor-capacitor (LC) tank coupled between the inverter and the non-inverting buffer circuitry; and a second LC tank coupled between the inverter and the non-inverting buffer circuitry.

12. The series resonance oscillator of claim 11, wherein the first transistor is an n-type metal oxide semiconductor (NMOS) transistor, and the second transistor is a p-type metal oxide semiconductor (PMOS) transistor.

13. The series resonance oscillator of claim 11, wherein the non-inverting buffer circuitry further includes:

a first resistance coupled between a reference node and the first current-carrying terminal of the first transistor, wherein the first current-carrying terminal is DC-biased via the first resistance; and a second resistance coupled between a voltage source the second current-carrying terminal of the second transistor, wherein the second current-carrying terminal is DC-biased via the second resistance.

14. The series resonance oscillator of claim 13, wherein the non-inverting buffer circuitry further includes:

a third resistance coupled between the voltage source and the first control terminal of the first transistor, wherein the first control terminal is DC-biased via the third resistance; and a fourth resistance coupled between the reference node the second control terminal of the second transistor, wherein the second control terminal is DC-biased via the fourth resistance.

15. The series resonance oscillator of claim 13, wherein the non-inverting buffer circuitry further includes:

a first inductance coupled between the voltage source and the first control terminal of the first transistor, wherein the first control terminal is DC-biased via the first inductance; and a second inductance coupled between the reference node the second control terminal of the second transistor, wherein the second control terminal is DC-biased via the second inductance.

16. The series resonance oscillator of claim 15, wherein the second LC tank includes the first inductance and the second inductance.

17. The series resonance oscillator of claim 16, wherein the non-inverting buffer circuitry further comprises:

a first capacitance coupled between an input of the non-inverting buffer circuitry and the first control terminal of the first transistor;

a second capacitance coupled between the input of the non-inverting buffer circuitry and the second control terminal of the second transistor;

a third capacitance coupled between an output of the non-inverting buffer circuitry and the first current-carrying terminal of the first transistor; and a fourth capacitance coupled between the output of the non-inverting buffer circuitry and the second current-carrying terminal of the second transistor.

18. The series resonance oscillator of claim 17, wherein the second LC tank further includes the first capacitance and the second capacitance, and the first LC tank includes the third capacitance and the fourth capacitance.

19. The series resonance oscillator of claim 16, further comprising:

a first inductive loop corresponding to the first inductance;

a second inductive loop corresponding to the second inductance; and a third inductive loop that is electromagnetically coupled to the first inductive loop and the second inductive loop.

20. The series resonance oscillator of claim 19, further comprising:

an output buffer coupled to the third inductive loop and configured to provide differential output signals for the series resonance oscillator based on signals received from the third inductive loop.

* * * * *